US010157682B2

(12) United States Patent
Chen et al.

(10) Patent No.: US 10,157,682 B2
(45) Date of Patent: Dec. 18, 2018

(54) DATA STORAGE DEVICE AND ERROR CORRECTION METHOD CAPABLE OF ADJUSTING VOLTAGE DISTRIBUTION BY READING PAGES

(71) Applicant: Silicon Motion, Inc., Jhubei, Hsinchu County (TW)

(72) Inventors: Chun-Yi Chen, Hsinchu (TW); Chun-Hui Chen, Hsinchu (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 2 days.

(21) Appl. No.: 14/989,080

(22) Filed: Jan. 6, 2016

(65) Prior Publication Data

US 2016/0117220 A1    Apr. 28, 2016

Related U.S. Application Data

(63) Continuation of application No. 14/271,897, filed on May 7, 2014, now Pat. No. 9,361,999.
(Continued)

(30) Foreign Application Priority Data

Oct. 24, 2013    (TW) .............................. 102138403 A

(51) Int. Cl.
*G06F 11/10* (2006.01)
*G11C 29/52* (2006.01)
(Continued)

(52) U.S. Cl.
CPC ........ *G11C 16/349* (2013.01); *G06F 11/0703* (2013.01); *G06F 11/1068* (2013.01);
(Continued)

(58) Field of Classification Search
CPC .. G06F 11/14; G06F 11/1402; G06F 11/1008; G06F 11/1028; G06F 11/1068;
(Continued)

(56) References Cited

U.S. PATENT DOCUMENTS 8,174,857 B1 * 5/2012 Sommer ............. G11C 11/5642
365/185.03
8,259,506 B1   9/2012 Sommer et al.
(Continued)

FOREIGN PATENT DOCUMENTS

CN         101529522 A    9/2009
KR    10-2008-0100791     11/2008

OTHER PUBLICATIONS

Korean Office Action dated Jul. 27, 2015, issued in application No. KR 10-2014-0066543.
English language translation of office action.

*Primary Examiner* — Christian M Dorman
(74) *Attorney, Agent, or Firm* — McClure, Qualey & Rodack, LLP

(57) ABSTRACT

The present invention provides a data storage device including a flash memory and a controller. The controller is configured to perform a first read operation to read a first page corresponding to a first word line of the flash memory according to a read command of a host, and perform a distribution-adjustment procedure when data read by the first read operation cannot be recovered by coding, wherein the controller is further configured to perform an adjustable read operation to read a second page corresponding to a second word line of the flash memory in the distribution-adjustment procedure.

14 Claims, 8 Drawing Sheets

Related U.S. Application Data

(60) Provisional application No. 61/829,482, filed on May 31, 2013.

(51) Int. Cl.
*G11C 16/26* (2006.01)
*G11C 16/34* (2006.01)
*G06F 11/07* (2006.01)
*G06F 11/14* (2006.01)
*G11C 29/02* (2006.01)
*G11C 29/42* (2006.01)
*G11C 7/14* (2006.01)
*G11C 29/04* (2006.01)

(52) U.S. Cl.
CPC ............ *G06F 11/141* (2013.01); *G11C 16/26* (2013.01); *G11C 29/021* (2013.01); *G11C 29/028* (2013.01); *G11C 29/42* (2013.01); *G11C 29/52* (2013.01); *G06F 11/0727* (2013.01); *G06F 11/1072* (2013.01); *G11C 7/14* (2013.01); *G11C 2029/0411* (2013.01)

(58) Field of Classification Search
CPC .. G06F 11/1072; G06F 11/07; G06F 11/0703; G06F 11/0727; G06F 11/0751; G06F 11/0754; G06F 11/076
See application file for complete search history.

(56) References Cited

U.S. PATENT DOCUMENTS

| | | |
|---|---|---|
| 2007/0091677 A1 | 4/2007 | Lasser |
| 2008/0198650 A1 | 8/2008 | Shalvi |
| 2009/0106485 A1 | 4/2009 | Anholt |
| 2010/0131827 A1 | 5/2010 | Sokolov |
| 2011/0231740 A1 | 9/2011 | Lasser et al. |
| 2013/0132652 A1 | 5/2013 | Wood |
| 2013/0159785 A1 | 6/2013 | Hashimoto |

\* cited by examiner

DATA STORAGE DEVICE AND ERROR CORRECTION METHOD CAPABLE OF ADJUSTING VOLTAGE DISTRIBUTION BY READING PAGES

CROSS REFERENCE TO RELATED APPLICATIONS

This application is a Continuation of U.S. patent application Ser. No. 14/271,897, filed on May 7, 2014, now U.S. Pat. No. 9,361,999, which claims the benefit of U.S. Provisional Application No. 61/829,482, filed May 31, 2013, the entirety of which is incorporated by reference herein. Furthermore, application Ser. No. 14/271,897 claims priority of Taiwan Patent Application No. 102138403, filed on Oct. 24, 2013, the entirety of which is incorporated by reference herein.

BACKGROUND OF THE INVENTION

Field of the Invention

The present invention relates to an error correction method applied to a data storage device, and in particular to an error correction method capable of adjusting the voltage distribution of the data storage device.

Description of the Related Art

Flash memory is considered a non-volatile data storage device, using electrical methods to erase and program itself. Taking NAND Flash as an example, it is often used as a memory card, USB flash device, solid state device, eMMC and other uses.

Flash memory such as NAND Flash uses a multiple-block structure to store data. Each block contains multiple pages. Due to the possibility of errors occurring during the flash memory data storage procedure, the system now encodes the original data then stores the encoded data into flash memory; when data is read, the encoded data is first extracted then decoded back into the original data. Even though the encoding and decoding procedure can decrease errors, this procedure is still limited in correcting parts of bit errors. When the number of errors exceeds a certain value, the flash memory controller realizes it is unable to decode the data effectively when proceeding with the decoding procedures.

BRIEF SUMMARY OF THE INVENTION

A detailed description is given in the following embodiments with reference to the accompanying drawings.

The present invention provides a data storage device that includes a flash memory and a controller. The controller is configured to perform a first read operation to read a first page corresponding to a first word line of the flash memory according to a read command from a host, and perform a distribution-adjustment procedure when data read by the first read operation cannot be recovered by coding, wherein the controller is further configured to perform an adjustable read operation to read a second page corresponding to a second word line of the flash memory in the distribution-adjustment procedure.

The present invention further provides an error correction method. The error correction method includes performing a first read operation to read a first page corresponding to a first word line of a flash memory of the data storage device according to a read command from a host; determining whether data read by the first read operation can be recovered by coding; and performing a distribution-adjustment procedure when data of the first page read by the first read operation cannot be recovered by coding, wherein the distribution-adjustment procedure comprises performing an adjustable read operation to read a second page corresponding to a second word line of the flash memory.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
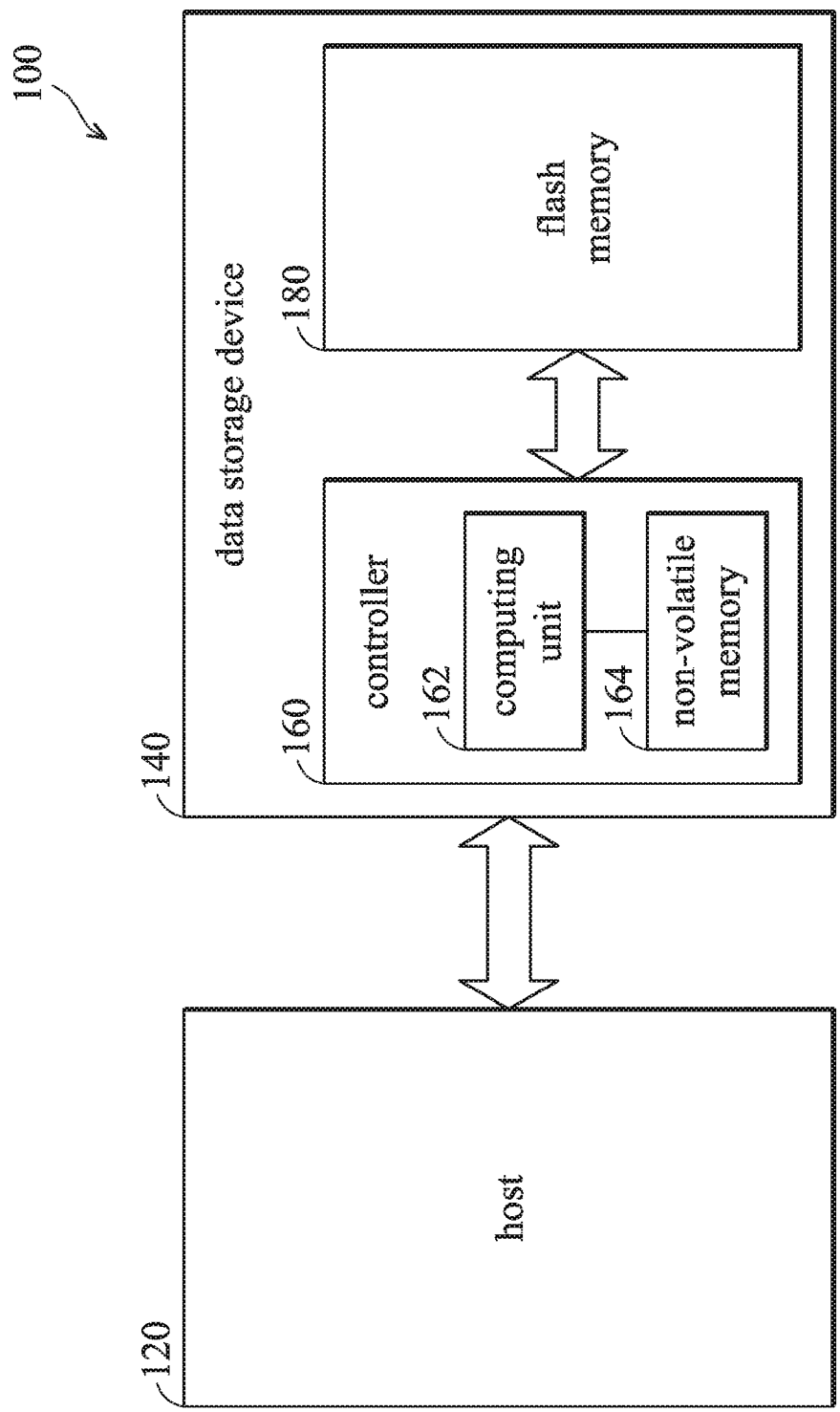
FIG. 1 is a schematic diagram illustrating an embodiment of an electronic system of the present invention.

FIG. 1 is a schematic diagram illustrating an embodiment of an electronic system of the present invention. The electronic system 100 includes a host 120 and a data storage device 140. The data storage device 140 includes a flash memory 180 and a controller 160, and the data storage device 140 may operate in response to the command of the host 110. The controller 160 includes a computing unit 162 and a nonvolatile memory, such as read only memory (ROM) 164. The program code and data stored in the nonvolatile memory 164 may be constituted to be a firmware, and performed by the computing unit 162, such that the controller 160 may control the flash memory 180 by the firmware. The flash memory 180 includes a plurality of pages, a plurality of word lines and plurality of bit lines, wherein each of the word lines is arranged to connect at least one page for selecting the target page. For example, if the flash memory 180 is Single-Level Cell (SLC) flash memory, each of the bit lines of the flash memory 180 is arranged to be coupled to one page. If the flash memory 180 is Multi-Level Cell (MLC) flash memory, each of the bit lines of the flash memory 180 is arranged to be coupled to two pages. If the flash memory 180 is Triple-Level Cell (TLC) flash memory, each of the bit lines of the flash memory 180 is arranged to be coupled to three pages, but it is not limited thereto.

The firmware is built for recovering the data that cannot be successfully read by an ordinary read operation. The present invention discloses an error correction method including a distribution-adjustment procedure, but it is not limited thereto. In another embodiment of the present invention, the error correction method includes a distribution-adjustment procedure and a voltage-setting procedure. The distribution-adjustment procedure of the present invention is arranged to read another page near the target page for adjusting the threshold voltage distribution of the target page which cannot successfully be read by the read disturbance effect. Moreover, the voltage-setting procedure of the present invention is arranged to read retry the target page and reset the read voltage of the flash memory 180 according to a Read Retry Table to re-read the target page. It should be noted that the target page is the page that the read command of the host 120 is required to read.

In one of the embodiments of the present invention, the controller 160 is configured to perform a first read operation on a first page corresponding to a first word line of the flash memory 180 to read the first page according to a read command of the host 120. Namely, the controller 160 is configured to perform the first read operation on the first page connected to the first word line of the flash memory 180 to read the first page according to the read command of the host 120. When data read by the first read operation cannot be recovered by coding, the controller 160 performs the distribution-adjustment procedure. In the distribution-adjustment procedure, the controller 160 is further configured to perform an adjustable read operation to read a second page corresponding to a second word line of the flash memory 180, wherein the first word line and the second word line are two different word line, and the first page and the second page are two different pages. Namely, the controller 160 is configured to perform the adjustable read operation to read the second page connected to the second word line of the flash memory 180. It should be noted that the adjustable read operation is reading the second page a predetermined number of times to adjust the threshold voltage distribution of the first page by read disturbance effect, wherein the predetermined number of times may be 1, 5, 10, 20, 30, 50, 100 or 500 times, but it is not limited thereto. The predetermined number of times may be determined according to the experimental data of the success rate of the distribution-adjustment procedure. Next, the controller 160 is further configured to perform a second read operation on the first page to read the first page again after the distribution-adjustment procedure. Moreover, when the controller 160 successfully reads the first page, the controller 160 transmits the data of the first page to the host 120.

If the second read operation cannot successfully read the data of the first page, the controller 160 is further configured to repeat the distribution-adjustment procedure until the data of the first page can be successfully read by the controller 160 or the number of times the distribution-adjustment procedure had been performed is more than a first predetermined number. For example, the first predetermined number may be 1, 5, 10, 20, 30, 50, 100 or 500 times, but it is not limited thereto. The first predetermined number may be determined according to the experimental data of the success rate of the distribution-adjustment procedure. When the number of times the distribution-adjustment procedure had been performed is more than a first predetermined number, the controller 160 is further configured to mark the first page as a bad page. For example, a register of the flash memory 180 or other memory can be used to record an adjustment count corresponding to the number of times the distribution-adjustment procedure has been performed. The controller 160 is further configured to increase the adjustment count by one every time the distribution-adjustment procedure is finished.

In another embodiment, the controller 160 performs the voltage-setting procedure when the number of times the distribution-adjustment procedure has been performed is more than the first predetermined number. Namely, in this embodiment, the voltage-setting procedure is performed after the distribution-adjustment procedure. In the voltage-setting procedure, the controller 160 is configured to perform a setting operation to set a voltage value on a register of the flash memory 180 according to a read retry table and the voltage value of the register serves as read voltage of the flash memory 180. For example, the read retry table may be stored in the nonvolatile memory 164, but it is not limited thereto. It should be noted that the controller 160 is configured to read the first page of a predetermined read voltage in the first read operation. Next, the controller 160 is further configured to perform a second read operation on the first page to read the first page again by the read voltage corresponding to the voltage value on the register after the voltage-setting procedure. Moreover, when the controller 160 successfully reads the first page, the controller 160 transmits the data of the first page to the host 120.

If the second read operation of the voltage-setting procedure cannot successfully read the data of the first page, the controller 160 is further configured to repeat the distribution-adjustment procedure and/or the voltage-setting procedure until the data of the first page can be successfully read or the time the voltage-setting procedure had been performed is more than a second predetermined number. For example, the second predetermined number may be 1, 5, 10, 20, 30, 50, 100 or 500 times, but it is not limited thereto. The second predetermined number may be determined according to the success rate of the voltage-setting procedure of the experimental data, but it is not limited thereto. Moreover, when the number of times the voltage-setting procedure had been performed is more than the second predetermined number, the controller 160 is further configured to mark the first page as a bad page. For example, a register of the flash memory 180 or other memory can be used to record a read retry count corresponding to the number of times the voltage-setting procedure had been performed. The controller 160 is further configured to increase the read retry count by one every time the voltage-setting procedure is finished.

In other embodiments of the present invention, the voltage-setting procedure is performed before the distribution-adjustment procedure. For example, the controller 160 is configured to perform a first read operation on a first page corresponding to a first word line to read the first page according to a read command. Namely, the controller 160 is configured to perform the first read operation on the first page connected to the first word line of the flash memory 180 to read the first page according to the read command of the host 120. When data read by the first read operation cannot be recovered by coding, the controller 160 performs the voltage-setting procedure. In the voltage-setting procedure, the controller 160 is configured to perform a setting operation to set voltage value on a register of the flash memory 180 according to a read retry table, and the voltage value of the register serves as read voltage of the flash memory 180, wherein other details of the voltage-setting procedure can be referred to the above sectors. Next, the controller 160 is further configured to perform a second read operation to read the first page again by the read voltage set by the setting operation after the voltage-setting procedure is finished. Moreover, when the controller 160 successfully reads the first page, the controller 160 transmits the data of the first page to the host 120.

If the second read operation after the voltage-setting procedure still cannot successfully read (recover) the data of the first page, the controller 160 is configured to repeat the voltage-setting procedure until the data of the first page can be successfully read or the time the voltage-setting procedure had been perform is more than a second predetermined number. Moreover, when the number of times the voltage-setting procedure had been performed is more than the second predetermined number, the controller 160 is further configured to mark the first page as a bad page. For example, a register of the flash memory 180 or other memory can be used for record a read retry count corresponding to the number of times the voltage-setting procedure had been performed. The controller 160 is further configured to increase the read retry count by one every times when the voltage-setting procedure is finished.

In another embodiment, when the number of times the voltage-setting procedure had been performed is more than the second predetermined number, the controller 160 is configured to perform the distribution-adjustment procedure. In the distribution-adjustment procedure, the controller 160 is configured to perform an adjustable read operation to read a second page corresponding to a second word line of the flash memory 180, wherein the adjustable read operation is arranged to read the second page by a predetermined number of times, and the other details of the distribution-adjustment procedure can be referred to above sectors. Next, the controller 160 is further configured to perform a second read operation on the first page to read the first page again after the distribution-adjustment procedure is finished. Moreover, when the controller 160 successfully reads the first page by the second read operation, the controller 160 transmits the data of the first page to the host 120.

If the second read operation of the voltage-setting procedure cannot successfully read the data of the first page, the controller 160 is further configured to repeat the distribution-adjustment procedure and/or the voltage-setting procedure until the data of the first page can be successfully read or the time the distribution-adjustment procedure had been perform is more than a first predetermined number. Moreover, when the number of times the distribution-adjustment procedure had been performed is more than the first predetermined number, the controller 160 is further configured to mark the first page as a bad page. For example, a register of the flash memory 180 or other memory can be used for record an adjustment count corresponding to the number of times the distribution-adjustment procedure had been performed. The controller 160 is further configured to increase the adjustment count by one every times when the distribution-adjustment procedure is finished.

Figure 2:
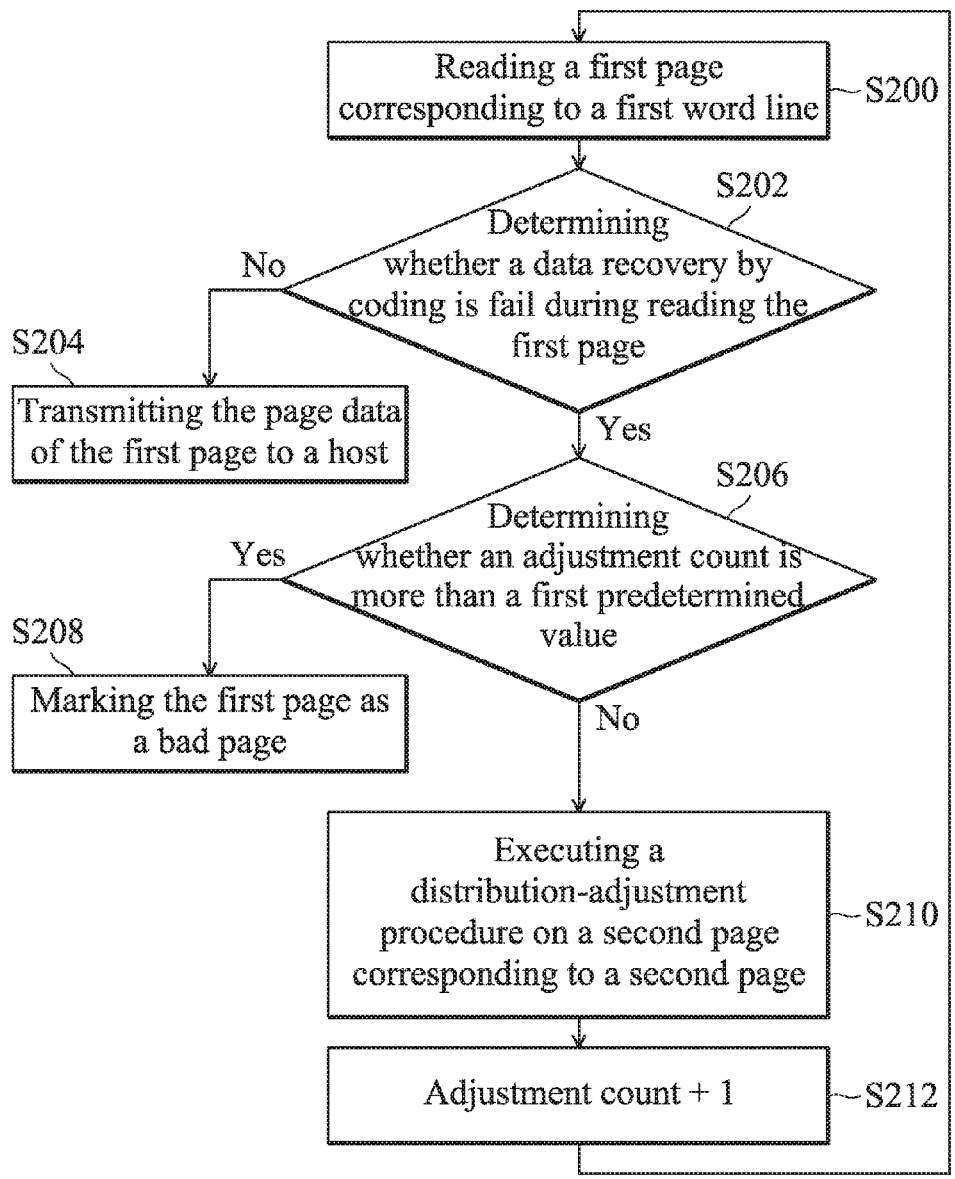
FIG. 2 is a flowchart of an error correction method according to an embodiment of the present invention.

FIG. 2 is a flowchart of an error correction method according to an embodiment of the present invention. The error correction method is applied to the data storage device 140 of FIG. 1. The process starts at step S200.

In step S200, the controller 160 is configured to perform a first read operation on a first page corresponding to a first word line of the flash memory 180 to read the first page according to a read command of the host 120. Namely, the controller 160 is configured to perform the first read operation on the first page connected to the first word line of the flash memory 180 to read the first page according to the read command of the host 120.

Next, in step S202, the controller 160 is configured to determine whether the data read by the first read operation can be recovered by coding. When the data read by the first read operation can be recovered by coding, the process goes to step S204, otherwise, the process goes to step S206.

In step S204, the controller 160 transmits the data of the first page which is successfully read in step S200 to the host 120.

In step S206, the controller 160 is configured to determine whether an adjustment count corresponding to the number of times the adjustable read operation had been perform is more than a first predetermined number. For example, a register of the flash memory 180 or other memory can be used for record an adjustment count corresponding to the number of times the distribution-adjustment procedure had been performed. When the adjustment count is more than the first predetermined number, the process goes to step S208, otherwise, the process goes to step S212.

In step S208, the controller 160 marks the first page as a bad page.

In step S210, the controller 160 performs the distribution-adjustment procedure. In the distribution-adjustment procedure, the controller 160 is further configured to perform an adjustable read operation to read a second page corresponding to a second word line of the flash memory 180, wherein the first word line and the second word line are two different word lines, and the first page and the second page are two different pages. Namely, the controller 160 is configured to perform the adjustable read operation to read the second page connected to the second word line of the flash memory 180. It should be noted that the adjustable read operation is reading the second page by a predetermined number of times to adjust the threshold voltage distribution of the first page by read disturbance effect, wherein the predetermined number of times may be 1, 5, 10, 20, 30, 50, 100 or 500 times, but it is not limited thereto. The predetermined number of times may be determined according to the experimental data of the success rate of the distribution-adjustment procedure.

Next, in step S212, the controller 160 is configured to increase the adjustment count by one. For example, the controller 160 is configured to increase a value of a register by one to record the adjustment count. Next, process goes to step S200.

Figure 3A:
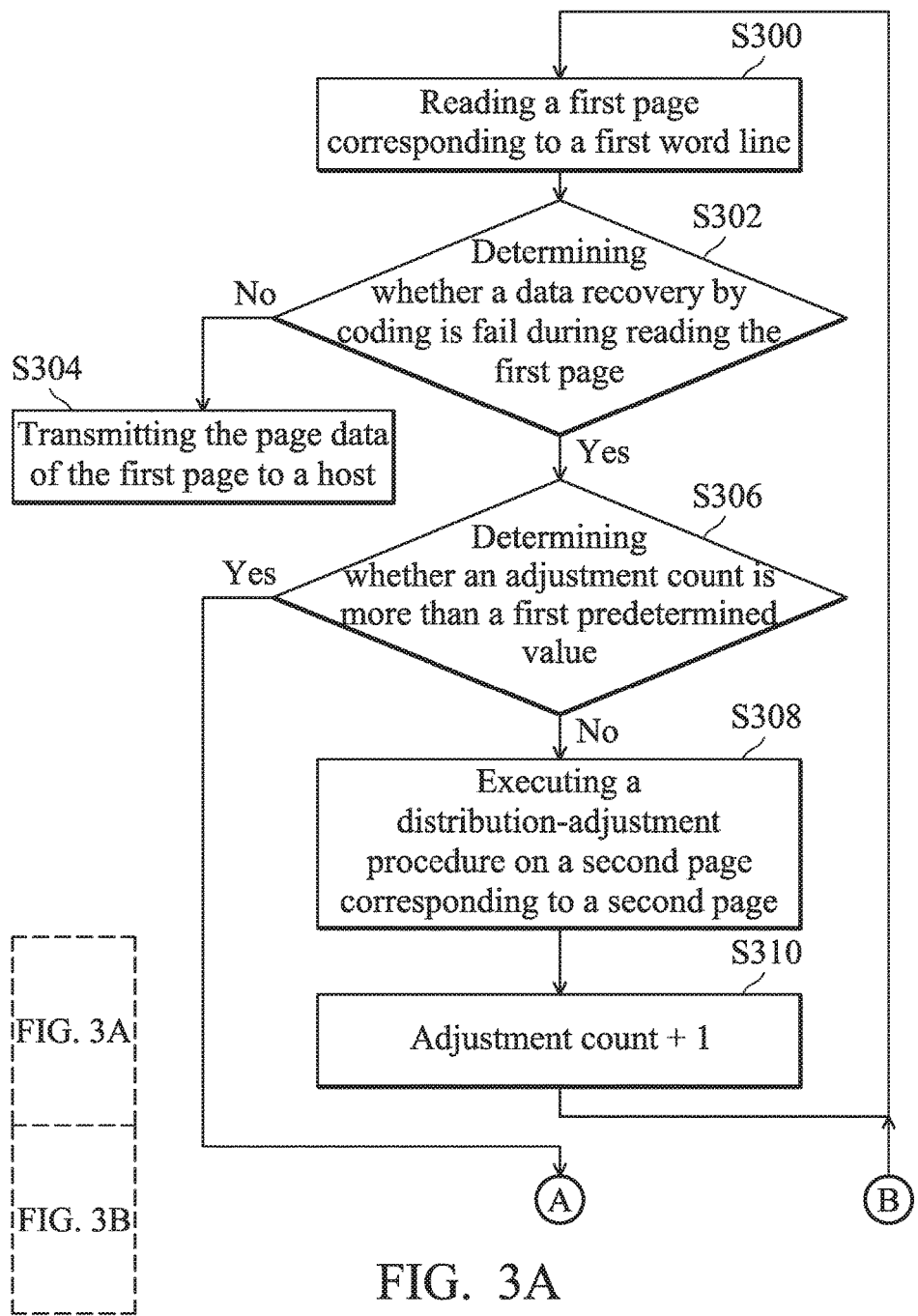
FIGS. 3A and 3B are a flowchart of another error correction method according to an embodiment of the present invention.
Figure 3B:
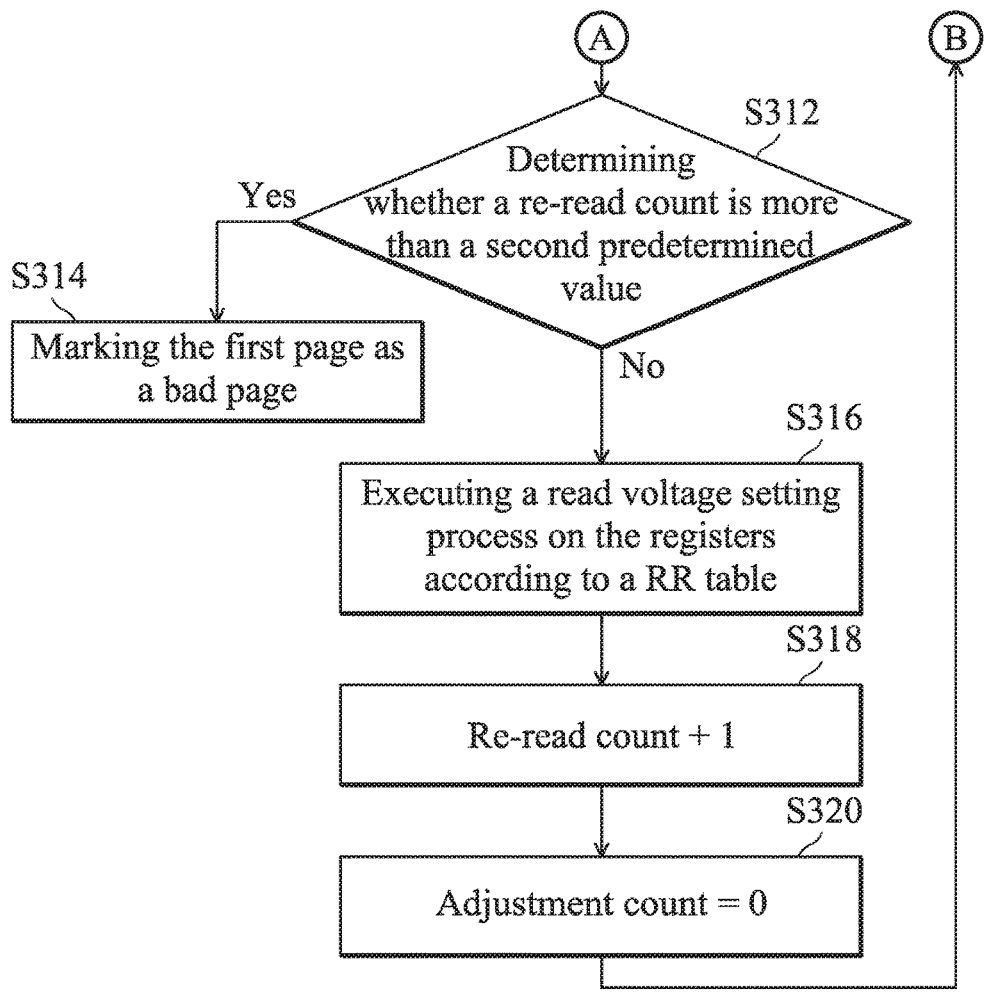

FIGS. 3A and 3B are a flowchart of another error correction method according to an embodiment of the present invention. The error correction method is applied to the data storage device 140 of FIG. 1. The process starts at step S300.

In step S300, the controller 160 is configured to perform a first read operation on a first page corresponding to a first word line of the flash memory 180 to read the first page according to a read command of the host 120. The details of step S300 can be referred to in step S200.

Next, in step S302, the controller 160 is configured to determine whether the data read by the first read operation can be recovered by coding. When the data read by the first read operation can be recovered by coding, the process goes to step S304, otherwise, the process goes to step S306.

In step S304, the controller 160 transmits the data of the first page which is successfully read in step S300 to the host 120.

In step S306, the controller 160 is configured to determine whether an adjustment count corresponding to the number of times the adjustable read operation had been perform is more than a first predetermined number. The details of step S306 can be referred to in step S206. When the adjustment count is more than the first predetermined number, the process goes to step S308, otherwise, the process goes to step S312.

In step S308, the controller 160 performs the distribution-adjustment procedure. In the distribution-adjustment procedure, the controller 160 is further configured to perform an adjustable read operation to read a second page corresponding to a second word line of the flash memory 180, wherein the first word line and the second word line are two different word lines, and the first page and the second page are two different pages. The details of step S308 can be referred to step S210.

Next, in step S310, the controller 160 is configured to increase the adjustment count by one. The details of step S310 can be referred to step S212. Next, the process goes to step S300.

In step S312, the controller 160 is further configured to determine whether a read retry count corresponding to the number of times the setting operation had been perform is more than a second predetermined number. For example, a register of the flash memory 180 or other memory can be used for record a read retry count corresponding to the number of times the voltage-setting procedure had been performed. When the read retry count is more than the second predetermined number, the process goes to step S314, otherwise, the process goes to step S316.

In step S314, the controller 160 marks the first page as a bad page.

In step S316, the controller 160 is configured to perform a setting operation to set voltage value on a register of the flash memory 180 according to a read retry table and serve the voltage value of the register as read voltage of the flash memory 180. For example, the read retry table may be stored in the nonvolatile memory 164.

Next, in step S318, the controller 160 is configured to increase the read retry count by one. For example, the controller 160 is configured to increase the value of a register or a memory block by one for record the read retry count.

Next, in step S320, the controller 160 resets the adjustment count to zero. For example, the controller 160 resets the value stored in the register or memory block to zero for the adjustment count. The process returns to step S300 to read the first page again by the read voltage set in step S316. It should be noted that, in this embodiment, the voltage-setting procedure is performed after the distribution-adjustment procedure. Moreover, in this embodiment, the controller 160 is configured to reset the adjustment count to zero before returning to step S300. Therefore, when the first page cannot be successfully read by the read voltage set in step S316, the controller 160 is further configured to perform the voltage-setting procedure again after the number of times the distribution-adjustment procedure had been performed is more than the first predetermined number, but it is not limited thereto.

In another embodiment, the error correction method of the 3A-3B can be performed without step S320. Namely, the controller 160 does not reset the adjustment count to zero, and the process returns to step S300. Therefore, the controller 160 will not perform the distribution-adjustment procedure again or perform the voltage-setting procedure again when the first page cannot be read by the read voltage set in step S316.

Figure 4A:
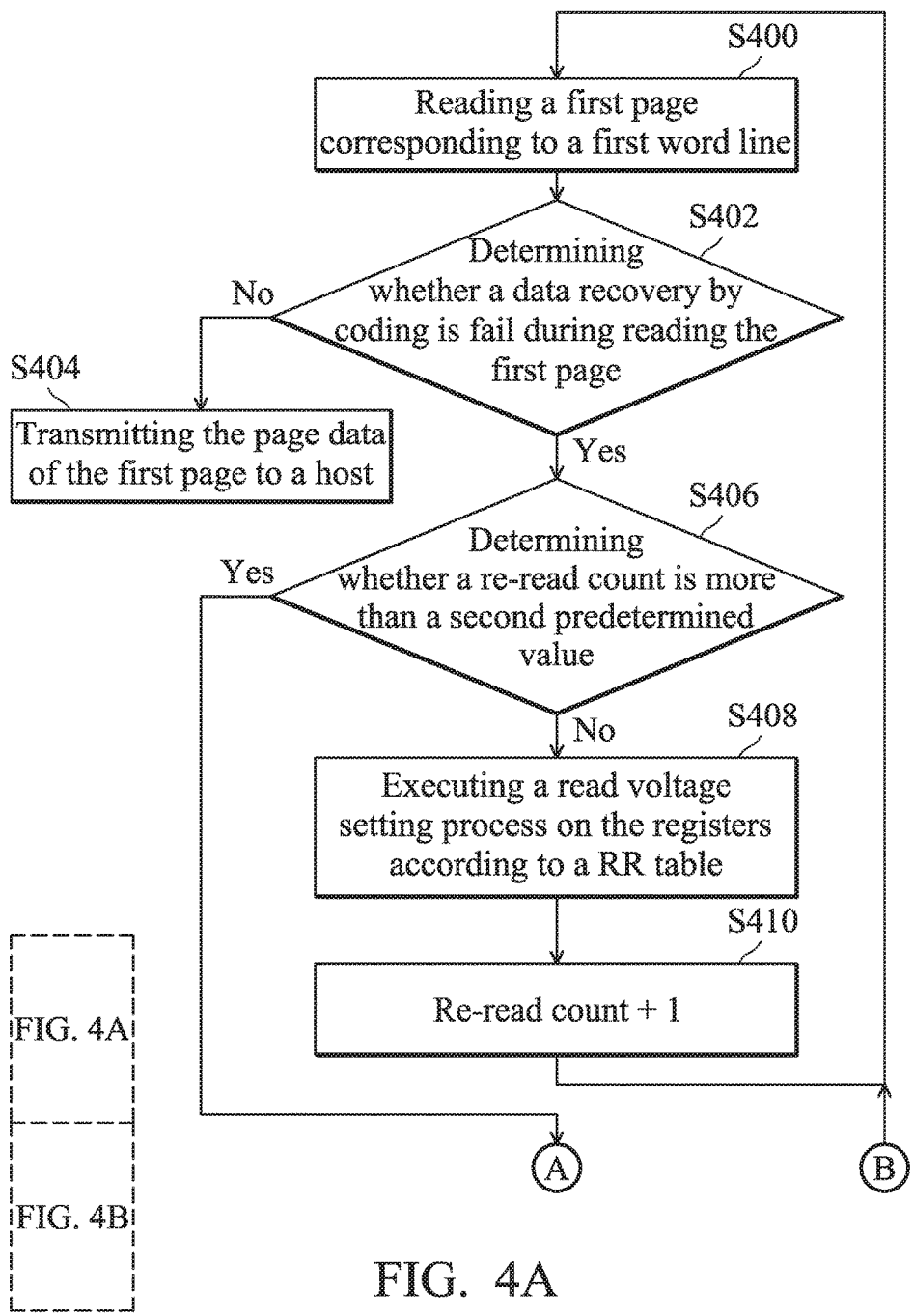
FIGS. 4A and 4B are a flowchart of another error correction method according to an embodiment of the present invention.
Figure 4B:
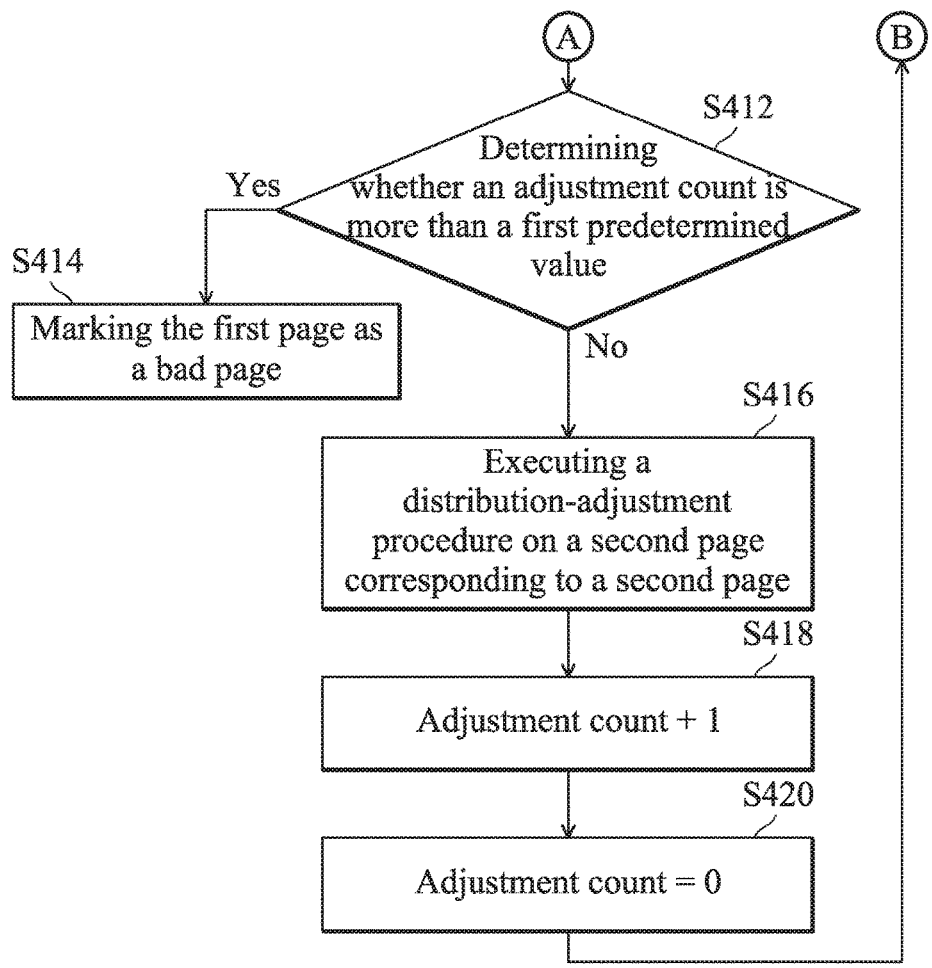

FIGS. 4A and 4B are a flowchart of another error correction method according to an embodiment of the present invention. The error correction method is applied to the data storage device 140 of FIG. 1. The process starts at step S400.

In step S400, the controller 160 is configured to perform a first read operation on a first page corresponding to a first word line of the flash memory 180 to read the first page according to a read command of the host 120. The details of step S300 can be referred to step S200.

Next, in step S402, the controller 160 is configured to determine whether the data read by the first read operation can be recovered by coding. When the data read by the first read operation can be recovered by coding, the process goes to step S404, otherwise, the process goes to step S406.

In step S404, the controller 160 transmits the data of the first page which is successfully read to the host 120.

In step S406, the controller 160 is further configured to determine whether a read retry count corresponding to the number of times the setting operation had been perform is more than a second predetermined number. The details of step S406 can be referred to step S312. When the read retry count is more than the second predetermined number, the process goes to step S412, otherwise, the process goes to step S408.

In step S408, the controller 160 performs a voltage-setting procedure. In the voltage-setting procedure, the controller 160 is configured to perform a setting operation to set the voltage value on a register of the flash memory 180 according to a read retry table and serve the voltage value of the register as read voltage of the flash memory 180. The details of step S408 can be referred to step S316.

Next, in step S410, the controller 160 is configured to increase the read retry count by one. The details of step S410 can be referred to step S318. Next, the process returns to step S400 to read the first page again by the read voltage set in step 408.

In step S412, the controller 160 is configured to determine whether an adjustment count corresponding to the number of times the adjustable read operation had been perform is more than a first predetermined number. The details of step S412 can be referred to step S206. When the adjustment count is more than the first predetermined number, the process goes to step S414, otherwise, the process goes to step S416.

In step S414, the controller 160 mark the first page as a bad page.

In step S416, the controller 160 performs the distribution-adjustment procedure. In the distribution-adjustment procedure, the controller 160 is further configured to perform an adjustable read operation to read a second page corresponding to a second word line of the flash memory 180, wherein the first word line and the second word line are two different word line, and the first page and the second page are two different pages. The details of step S308 can be referred to step S210.

Next, in step S418, the controller 160 is configured to increase the adjustment count by one. The details of step S418 can be referred to step S212.

Next, in step S420, the controller 160 is configured to reset the read retry count to zero. For example, the controller 160 resets the value stored in the register or memory block to zero for the read retry count. The process returns to step S400. It should be noted that, in this embodiment, the voltage-setting procedure is performed before the distribution-adjustment procedure. Moreover, in this embodiment, the controller 160 returns to step S400 after the read retry count is set to zero. Therefore, the controller 160 is configured to perform the voltage-setting procedure after the distribution-adjustment procedure cannot successfully read the first page. The controller 160 is configured to perform the distribution-adjustment procedure again after the voltage setting process had been perform by the number of times equal to the second predetermined number, but it is not limited thereto.

In another embodiment, the error correction method of FIGS. 4A and 4B can be performed without step S420. Namely, the controller 160 may return to step S400 directly without setting the read retry count to zero. Therefore, when the distribution-adjustment procedure cannot successfully read the first page, the controller 160 will not perform the voltage-setting procedure again, but it performs the distribution-adjustment procedure again.

Figure 5A:
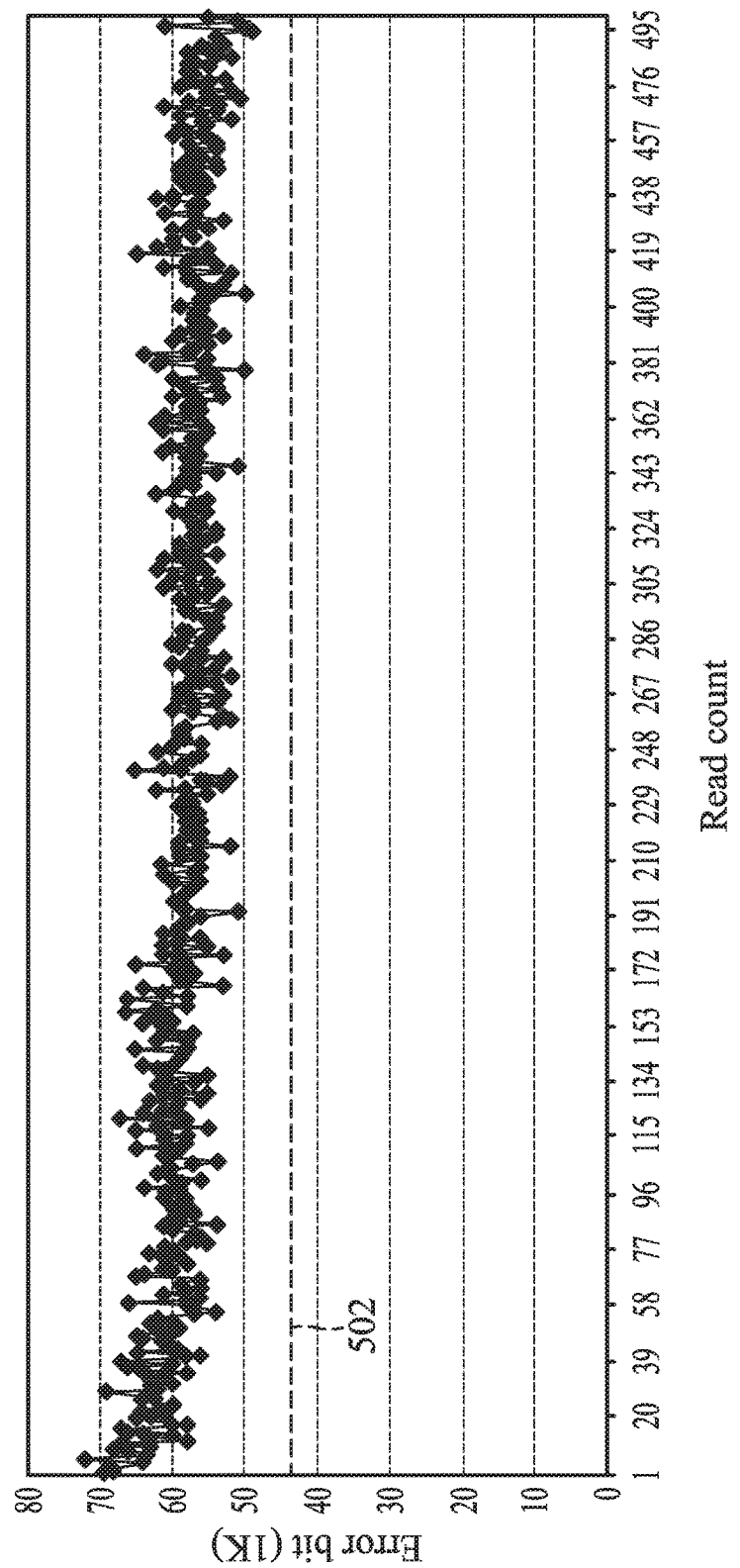
FIG. 5A is an error bit simulation diagram of the voltage-setting procedure of the present invention.

FIG. 5A is a simulation diagram of the page after the voltage-setting procedure of the present invention. In this simulation diagram, the controller 160 reads the target page 500 times after the voltage-setting procedure. As shown in FIG. 5A, the error bits decrease after reading the target page 500 times, but the number of error bits is still above the threshold line 502.

Figure 5B:
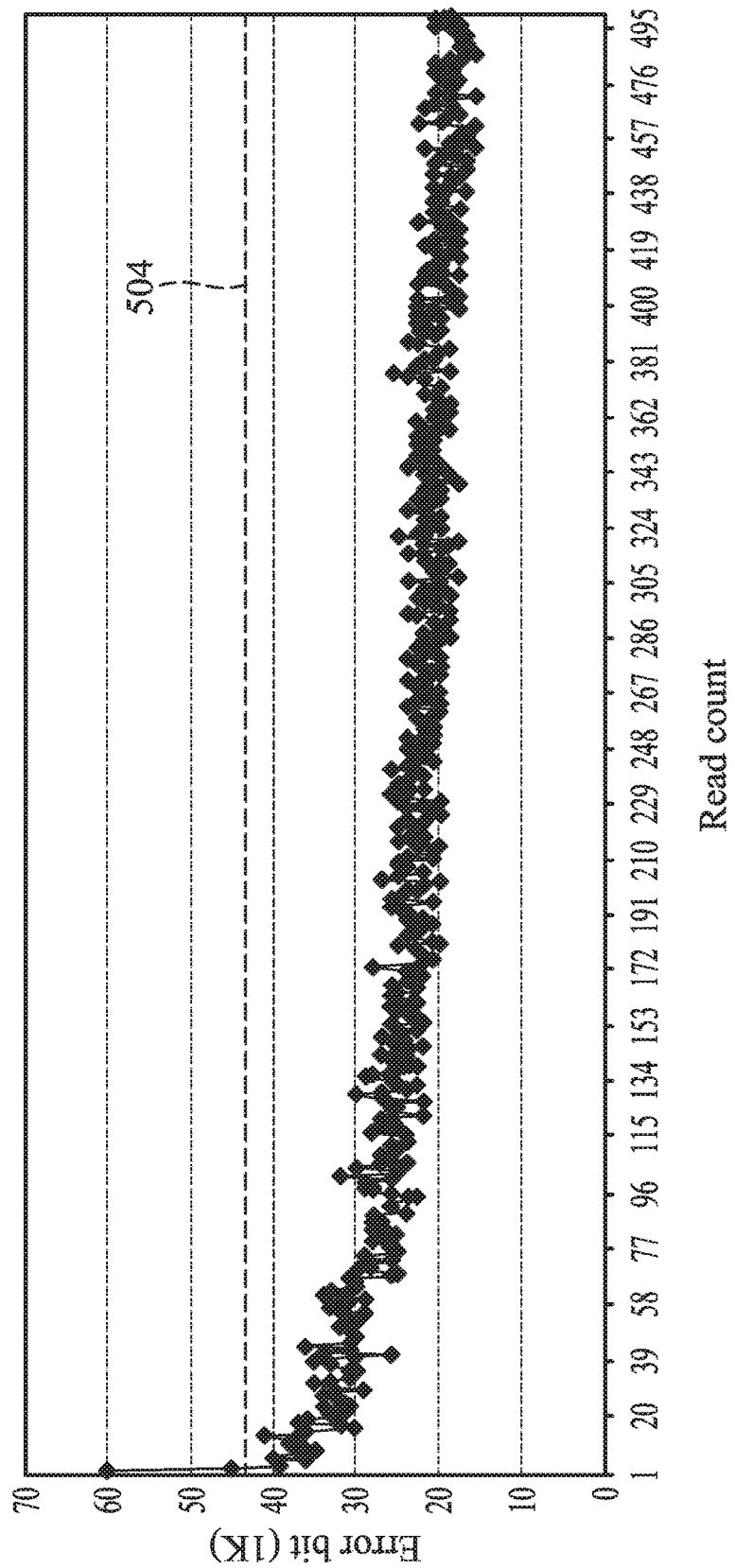
FIG. 5B is an error bit simulation diagram of the distribution-adjustment procedure of the present invention.

FIG. 5B is an error bit simulation diagram of the target page after the distribution-adjustment procedure of the present invention. The simulation diagram shows the result of reading the target page after performing the distribution-adjustment procedure 500 times. As shown in FIG. 5B, the error bits are below the threshold line 504 after the first time that the controller 160 performed the distribution-adjustment procedure.

The data storage device 140 and the error correction method of the present invention can read another page near the target page, such that the read disturbance effect occurs and the threshold voltage distribution of the target page is changed due to the read disturbance effect. Moreover, the voltage-setting procedure may perform a read retry on the target page to read the target page by a different read voltage.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory; and
a controller, configured to:
perform a first read operation to read a first page corresponding to a first word line of the flash memory according to a read command of a host,
perform a distribution-adjustment procedure when data read by the first read operation cannot be recovered by coding,
perform an adjustable read operation to read a second page corresponding to a second word line of the flash memory in the distribution-adjustment procedure, and the first word line and the second word line are different,
determine whether the number of times the distribution-adjustment procedure having been performed is more than a first predetermined number, wherein the first predetermined number is greater than 1, and
perform a voltage-setting procedure when a number of times the distribution-adjustment procedure having been performed is more than the first predetermined number, wherein, in the voltage-setting procedure, the controller is further configured to perform a setting operation to set a voltage value on a register of the flash memory according to a read retry table and the voltage value of the register serves as read voltage of the flash memory.

2. The data storage device as claimed in claim 1, wherein the controller is further configured to determine whether an adjustment count corresponding to the number of times the adjustable read operation having been performed is more than the first predetermined number, and mark the first page as a bad page when the adjustment count is more than the first predetermined number.

3. The data storage device as claimed in claim 1, wherein the controller is further configured to perform a second read operation on the first page to read the first page again by the read voltage corresponding to the voltage value on the register after the voltage-setting procedure.

4. The data storage device as claimed in claim 1, wherein the voltage-setting procedure is performed after the distribution-adjustment procedure has been performed, and the controller is further configured to determine whether an adjustment count corresponding to the number of times the adjustable read operation has been performed is more than the first predetermined number in the distribution-adjustment procedure, and start to perform the voltage-setting procedure when the adjustment count is more than the first predetermined number.

5. The data storage device as claimed in claim 4, wherein the controller is further configured to determine whether a read-retry count corresponding to the number of times the setting operation has been performed is more than a second predetermined number in the voltage-setting procedure, and mark the first page as a bad page when the read-retry count is more than the second predetermined number.

6. An error correction method, applied to a data storage device, comprising:
performing a first read operation to read a first page corresponding to a first word line of a flash memory of the data storage device according to a read command of a host;
determining whether data read by the first read operation can be recovered by coding;
performing a distribution-adjustment procedure when data of the first page read by the first read operation cannot be recovered by coding, wherein the distribution-adjustment procedure comprises performing an adjustable read operation to read a second page corresponding to a second word line of the flash memory, and the first word line and the second word line are different;
determining whether the number of times the distribution-adjustment procedure having been performed is more than a first predetermined number, wherein the first predetermined number is greater than 1, and performing a voltage-setting procedure when a number of times the distribution-adjustment procedure having been performed is more than the first predetermined number; and in the voltage-setting procedure, performing a setting operation to set a voltage value on a register of the flash memory according to a read retry table and the voltage value of the register serves as read voltage of the flash memory.

7. The error correction method as claimed in claim 6, further comprising performing a second read operation on the first page to read the first page again after the distribution-adjustment procedure.

8. The error correction method as claimed in claim 6, wherein the distribution-adjustment procedure further comprises:
   determining whether an adjustment count corresponding to the number of times the adjustable read operation had been performed is more than the first predetermined number; and
   marking the first page as a bad page when the adjustment count is more than the first predetermined number.

9. The error correction method as claimed in claim 6, further comprising performing a second read operation on the first page to read the first page again by the read voltage corresponding to the voltage value on the register after the voltage-setting procedure.

10. The error correction method as claimed in claim 6, wherein the voltage-setting procedure further comprises:
    determining whether a read-retry count corresponding to the number of times the setting operation had been performed is more than a second predetermined number, wherein the setting operation is performed when the read-retry count is not more than the second predetermined number; and
    increasing the read-retry count by one when the setting operation is finished.

11. The error correction method as claimed in claim 6, wherein the voltage-setting procedure is performed after the distribution-adjustment procedure has been performed, and the distribution-adjustment procedure further comprises:
    determining whether an adjustment count corresponding to the number of times the adjustable read operation had been performed is more than the first predetermined number, wherein the adjustable read operation is performed only when the adjustment count is not more than the first predetermined number; and
    increasing the adjustment count by one when the adjustable read operation is finished.

12. The error correction method as claimed in claim 11 wherein the voltage-setting procedure is started to be performed when the adjustment count is more than the first predetermined number.

13. The error correction method as claimed in claim 11, wherein the voltage-setting procedure further comprises:
    determining whether a read-retry count corresponding to the number of times the setting operation had been performed is more than a second predetermined number, wherein the setting operation is performed only when the read-retry count is not more than the second predetermined number; and
    increasing the read-retry count by one when the setting operation is finished.

14. The error correction method as claimed in claim 13, further comprising marking the first page as a bad page when the read-retry count is more than the second predetermined number.

* * * * *